United States Patent
Nagasue

(10) Patent No.: US 7,173,464 B2
(45) Date of Patent: Feb. 6, 2007

(54) DUTY ADJUSTMENT CIRCUIT

(75) Inventor: Makoto Nagasue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 22 days.

(21) Appl. No.: 11/058,635

(22) Filed: Feb. 16, 2005

(65) Prior Publication Data

US 2005/0184781 A1 Aug. 25, 2005

(30) Foreign Application Priority Data

Feb. 25, 2004 (JP) ............................. 2004-049278

(51) Int. Cl.
*H03K 7/08* (2006.01)
(52) U.S. Cl. ....................... 327/175; 327/116
(58) Field of Classification Search ................. 327/175
See application file for complete search history.

(56) References Cited

U.S. PATENT DOCUMENTS 6,426,660 B1 * 7/2002 Ho et al. .................... 327/175
6,456,660 B1 * 9/2002 Yokoyama ............. 375/240.16
2003/0184350 A1 * 10/2003 Wang et al. ................. 327/115

FOREIGN PATENT DOCUMENTS

JP 10-163823 6/1998

* cited by examiner

*Primary Examiner*—Long Nguyen
*Assistant Examiner*—Ryan C. Jager
(74) *Attorney, Agent, or Firm*—Volentine Francos & Whitt, PLLC

(57) ABSTRACT

In a duty adjustment circuit, a clock signal is frequency-divided to ½" by a frequency divider. In a first frequency doubler among n cascade-connected frequency doublers, the divided clock signal is delayed by a variable delay portion according to a control signal. The exclusive logical sum of the delayed signal and the divided clock signal in the frequency-doubling portion doubles the frequency. The average voltage of the frequency-doubled signal is detected by an average value detection portion, and is compared with a reference voltage by a comparison control portion. A control signal is fed back to the variable delay portion to cause the average voltage to become equal to the reference voltage. In this manner, a clock signal is generated from the last frequency doubler with frequency equal to that of the original clock signal, and with duty ratio adjusted to a desired value.

19 Claims, 3 Drawing Sheets

DUTY ADJUSTMENT CIRCUIT

BACKGROUND OF THE INVENTION

1. Field of the Invention

This invention relates to a duty adjustment circuit which adjusts the duty ratio of a clock signal to a desired value.

2. Description of the Related Art

Japanese Patent Kokai (Laid-open Application) No. 10-163823 discloses a conventional duty ratio correction circuit. In the following, the same reference numerals and symbols as used in Japanese Patent Kokai No. 10-163823 are used with parentheses for easier understanding of this prior art. This duty ratio correction circuit includes a first CR integration circuit (101) to integrate a clock signal (CKI) with a time constant (T1) shorter than a half-period thereof. The duty ratio correction circuit also includes a second CR integration circuit (102) to integrate the same clock signal (CKI) with another time constant (T2) substantially longer than the period thereof. The duty ratio correction circuit compares the output signals of the CR integration circuits (101) and (102) using a comparator (16) and outputs the comparison result as a duty ratio correction clock signal (CKO).

In this duty ratio correction circuit, the output signal of the comparator (16) is fed back to the input side via a feedback resistance, and added to the output signal of the second CR integration circuit (102). Accordingly, the comparator (16) acquires a hysteresis characteristic, so that noise of amplitude smaller than this hysteresis can be excluded. When the duty ratio of the input clock signal (CKI) is not 50%, the output voltage of the first CR integration circuit (101) and the output voltage of the second CR integration circuit (102) tend toward the same level, so that the duty ratio of the duty ratio correction clock signal (CKO) generated as the result of comparison of these output voltages is improved and approaches 50%.

However, when noise of amplitude greater than the hysteresis (e.g., high-level instantaneous noise due to electrostatic discharge or other causes) is applied to the above described duty ratio correction circuit, this duty ratio correction circuit cannot exclude the noise, so that a clock signal with an extremely short pulse width is generated. As a result, in a circuit which receives the clock signal, there is the possibility of erroneous operation or of entering an inoperable state.

SUMMARY OF THE INVENTION

One object of this invention is to provide a duty adjustment circuit which suppresses adverse effects of high-level instantaneous noise, and adjusts the duty ratio of a clock signal to a desired value (for example, 50%).

According to a first aspect of the invention, there is provided a duty adjustment circuit, which uses a signal resulting by dividing the frequency of an input clock signal by $2^n$ (where n is a natural number) to generate a clock signal at the same frequency as the input clock signal but with the duty ratio adjusted to a prescribed value by means of n stages of frequency doublers in a cascade connection. Each frequency doubler includes a variable delay portion, which delays the signal supplied from the previous stage by an amount of time according to a control signal. The frequency doubler also includes a frequency doubler portion, which takes the exclusive logical sum of the input signal and a signal delayed by the variable delay portion to supply to the next stage a signal at double the frequency. The frequency doubler also includes an average value detection portion, which detects the average voltage of the frequency-doubled signal. The frequency doubler also includes a comparison control portion, which compares the average voltage with a reference voltage, adjusts the control signal such that the average voltage becomes equal to the reference voltage, and applies the control signal to the variable delay portion.

The input clock signal is frequency-divided by $2^n$, so that the influences of high-level instantaneous noise can be suppressed. Also, when the frequency is returned to the original frequency by the n stages of frequency doublers, delay times are adjusted such that the average voltage of the signal generated from each frequency doubler matches a reference voltage, so that a clock signal having a prescribed duty ratio can be generated.

These and other objects, aspect and novel features of this invention will become more clear upon reading the following detailed description and appended claims in conjunction with the accompanying drawings. The drawings are primarily explanatory in nature, and do not limit the scope of this invention.

DETAILED DESCRIPTION OF THE INVENTION

Figure 1:
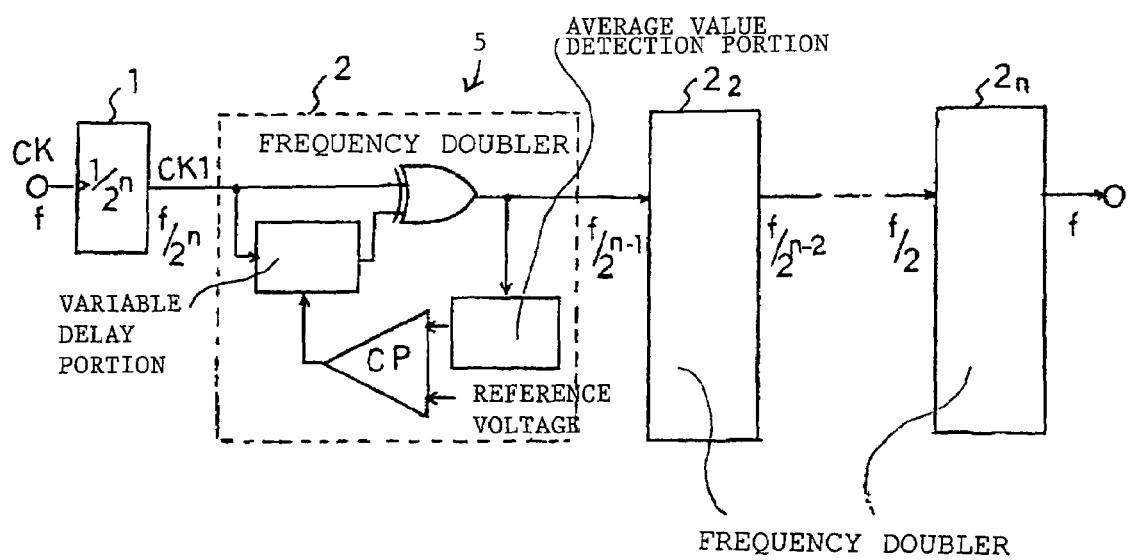
FIG. 1 schematically illustrates a basic configuration of an exemplary duty adjustment circuit according to this invention.

Referring to FIG. 1, an outline of a duty adjustment circuit 5 will be described.

This duty adjustment circuit 5 includes a frequency divider 1 which reduces the frequency of an input clock signal CK to $1/2^n$ by alternately inverting the output signal with the timing of the rising or falling edge of the clock signal CK, as for example in a binary counter, and a plurality of frequency doublers $2_1, 2_2, \ldots, 2_n$, cascade-connected after the frequency divider 1.

All of the frequency doublers $2_1$ to $2_n$ are similarly configured, as for example shown as the frequency doubler $2_1$. Each frequency doubler $2_i$ includes a variable delay portion, which causes the input clock signal CK1 to be delayed by a time specified by a control signal. The frequency doubler $2_i$ also includes a doubling portion, which takes an exclusive logical sum of the clock signal CK1 and the signal output by the variable delay portion to double the frequency. The frequency doubler $2_i$ also includes an average value detection portion, which detects the average voltage of this frequency-doubled signal. The frequency doubler $2_i$ also includes a comparison control portion (CP) which compares the average voltage with a reference voltage, and feeds back the control signal to the variable delay portion such that the average voltage becomes equal to the reference voltage.

The frequency of the clock signal CK is divided by $2^n$ by the frequency divider 1 to provide a clock signal CK1 having a duty ratio of 50%. Next, in the frequency doubler $2_1$, by setting the reference voltage to $1/2$ of the power supply voltage, the frequency of the clock signal CK1 is doubled, and the duty ratio of the clock signal is adjusted to 50%. The output signal of the frequency doubler $2_1$ is successively frequency-doubled by the frequency doublers $2_2, \ldots, 2_n$, so that the final-stage frequency doubler $2_n$ outputs a clock signal CLK the frequency of which is equal to the frequency of the original clock signal CK, and the duty ratio of which has been adjusted to 50%.

Embodiment 1

Figure 2:
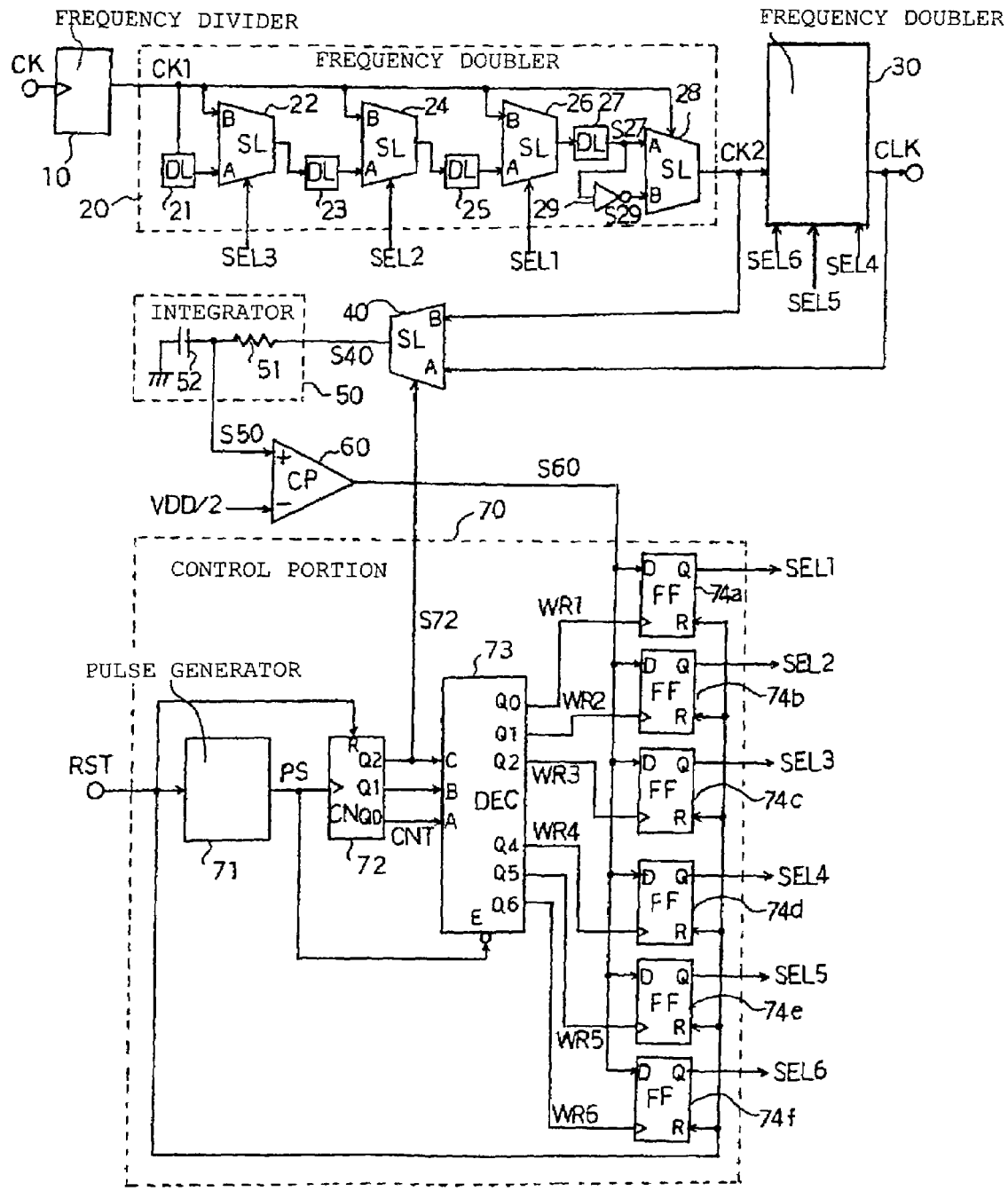
FIG. 2 is a detailed circuit diagram of a duty adjustment circuit according to one embodiment of this invention; and, FIG. 3 is a signal waveform diagram showing the operation of the duty adjustment circuit of FIG. 2.

FIG. 2 is a circuit diagram of a duty adjustment circuit 5', showing an embodiment of this invention.

This duty adjustment circuit 5' has a frequency divider 10 which divides the frequency of the clock signal CK for adjustment by 4. This frequency divider 10 includes for example a two-bit binary counter, and outputs a clock signal CK1 with a duty ratio of 50%. The clock signal CK1 generated from the frequency divider 10 is provided to the frequency doubler 20.

The frequency doubler 20 is configured to generate a clock signal CK2 with double the frequency of the clock signal CK1, and also to enable adjustment of the duty ratio of the clock signal CK2 according to selection signals SEL1 to SEL3.

This frequency doubler 20 has a delay unit (DL) 21 to which the clock signal CK1 is introduced, and a selector (SL) 22. The output signal of the delay unit 21 is supplied to an input terminal A of the selector 22, and the clock signal CK1 is supplied to an input terminal B of the selector 22. The selector 22 selects the input terminal A when the selection signal SEL3 is at level "H", and selects the input terminal B when at level "L". The output of the selector 22 is connected, via the delay unit 23, to the input terminal A of the selector 24, and the clock signal CK1 is provided to the input terminal B of the selector 24. The selector 24 selects the input terminal A or B according to whether the level of the selection signal SEL2 is "H" or "L".

The output of the selector 24 is connected, via the delay unit 25, to the input terminal A of the selector 26, and the clock signal CK1 is supplied to the input terminal B of the selector 26. The selector 26 selects the input terminal A or B according to whether the level of the selection signals SEL1 is "H" or "L". The output of the selector 26 is connected, via the delay unit 27, to the input terminal A of the selector 28 and also, via an inverter 29, to the input terminal B of the selector 28. The selector 28 selects the input terminal A or B according to whether the level of the clock signal CK1 is "H" or "L". Here, the clock signal CK1 serves as a selection signal.

A clock signal CK2, with frequency doubled and with duty ratio adjusted, is then generated from the output of the selector 28. The clock signal CK2 is supplied to a frequency doubler 30. The configuration of the frequency doubler 30 is similar to the frequency doubler 20. The desired clock signal CLK is issued from this frequency doubler 30. The frequency doubler 30 is provided with selection signals SEL4 through SEL6, not the selection signals SEL1 through SEL3.

The clock signals CLK and CK2 are supplied to the input terminals A and B respectively of the selector 40. The output of the selector 40 is connected to an integrator 50 which includes a resistance 51 and a capacitor 52. The integrator 50 detects the average voltage of the clock signal selected by the selector 40, and has a time constant substantially longer than the period of the clock signal. The signal S50 from the integrator 50 is supplied to the + input terminal of the comparator 60. The comparator 60 outputs an "H" signal S60 when the signal S50 is higher than the reference voltage (in this case, ½ the power supply voltage VDD) supplied to the − input terminal. The signal S60 which is the result of comparison is supplied to the control portion 70.

The control portion 70 generates the selection signals SEL1 to SEL6 to be supplied to the frequency doublers 20 and 30 according to the signal S60, based on a reset signal RST supplied from outside.

This control portion 70 has a pulse generator 71 which, when the reset signal RST is cancelled (for example, upon changing from "H" to "L"), generates pulse signals PS at for example level "L", in a prescribed number (here, seven) and at a prescribed interval (a time approximately equal to or greater than the time constant of the integrator). The pulse signals PS are applied to the clock terminal of a three-digit binary counter (CN) 72.

The binary counter 72 adds one to its count value CNT at each rising edge of the pulse signal PS while the reset signal RST is "L", and outputs binary signals from the output terminals Q0, Q1, Q2. The output terminals Q0 to Q2 of the binary counter 72 are connected to the input terminals A, B, C of a decoder (DEC) 73. The signal S72 from the output terminal Q2 of the binary counter 72 is applied to the selector 40 as a selection signal.

The decoder 73 decodes the binary signals provided to the input terminals A through C, and when the pulse signal WR supplied to the enable terminal E is "L", outputs an "H" write signal WR from the output terminal Q1 among the eight output terminals Q0 to Q7 corresponding to the value i (i=0 to 7) of the input signal. "L" is output when the pulse signal PS is "H". "L" is also output from output terminals not corresponding to the value of i.

The write signals WR1, WR2, WR3, WR4, WR5 and WR6 generated from the output terminals Q0, Q1, Q2, Q4, Q5 and Q6 of the decoder 73 are respectively applied to the clock terminals of D-type flip-flops (hereafter "FFs") 74a, 74b, 74c, 74d, 74e and 74f. The signal S60 from the comparator 60 is applied in common to the input terminals D of the FFs 74a to 74f, and the reset signal RST is applied in common to the reset terminals R of the FFs 74a to 74f. The selection signals SEL1, SEL2, SEL3, SEL4, SEL5 and SEL6 are respectively generated from the output terminals Q of the FFs 74a to 74f.

Figure 3:
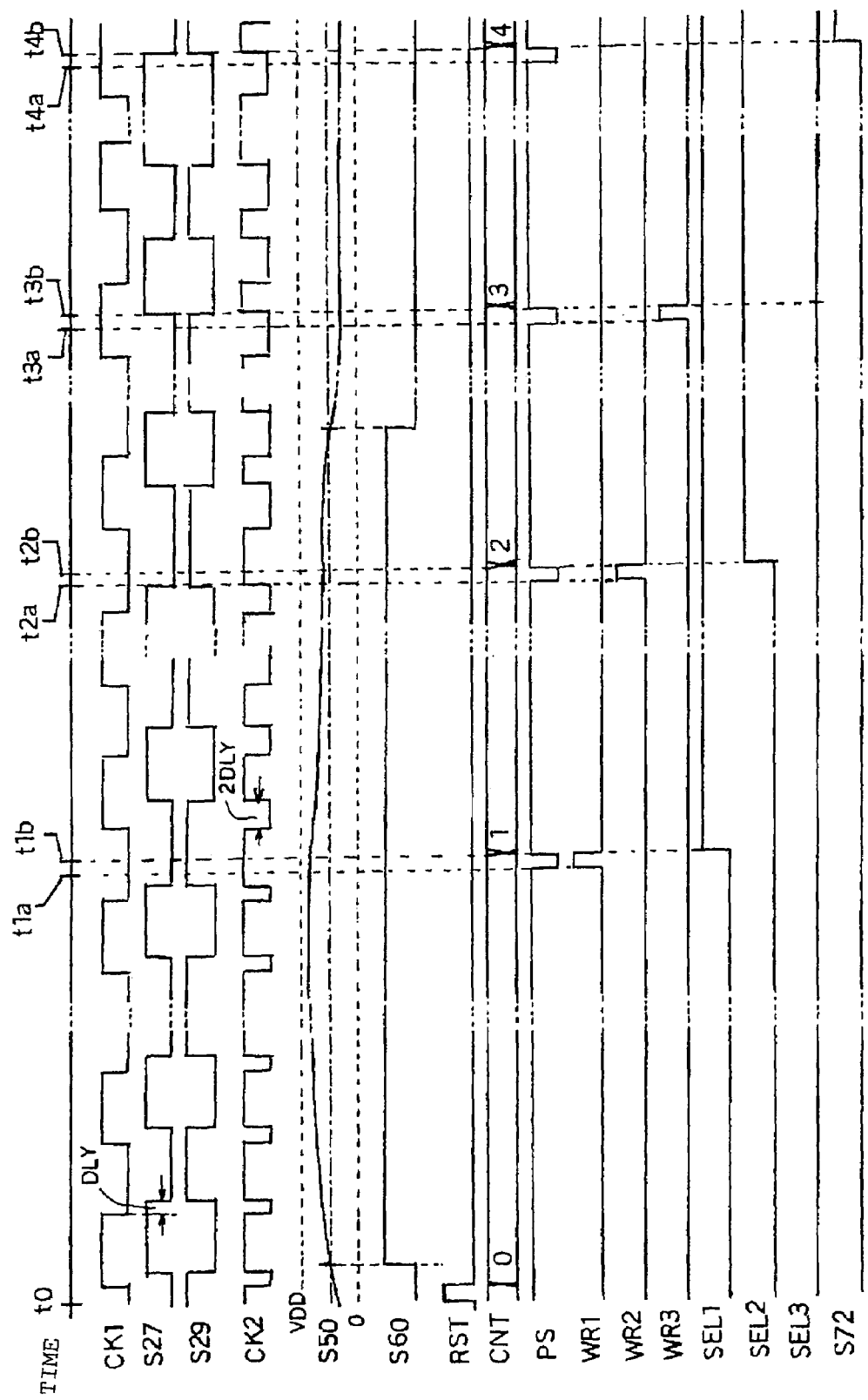

FIG. 3 is a signal waveform diagram showing the operation (mainly of the frequency doubler 20) of the duty adjustment circuit 5' shown in FIG. 2. Below, the operation of the circuit 5' shown in FIG. 2 is explained referring to FIG. 3.

An externally input clock signal CK is frequency-divided by 4 by the frequency divider 10, to become a clock signal CK1 with duty ratio of 50%, which is supplied to the frequency doubler 20.

At time t0 in FIG. 3, the reset signal RST applied from outside temporarily goes to "H" and then returns to "L". Thus, the binary counter 72 of the control portion 70 is reset, the count value CNT becomes 0, and the signal S72 goes to "L". As a result, the selector 40 is switched to the side of the clock signal CK2. Also, the FFs 74a to 74f are reset, and the selection signals SEL1 to SEL6 all go to "L".

In the frequency doubler 20, the selection signals SEL1 to SEL3 are "L", so that the clock signal CK1 passes through the selector 26 and delay unit 27 and is introduced to the input terminal A of the selector 28 as a signal S27. The signal S27 is inverted by the inverter 28, to become the signal S29 which is transferred to the input terminal B of the selector 28. Hence the delay time of the clock signal CK1 is the delay caused by one delay unit (DLY).

In the selector 28, the signals S27 and S29 are selected in alternation, with the clock signal CK1 as the selection signal, and the selected signal is output as the clock signal CK2. Accordingly, the frequency of the output clock signal CK2 is double that of the input clock signal CK1. By setting the delay time DLY to a time shorter than one-half the period of the clock signal CK1, the duty ratio of the clock signal CK2 becomes equal to or greater than 50%.

The clock signal CK2 is provided to the integrator 50 via the selector 40, and a signal S50, corresponding to the average voltage of the clock signal CK2, is output from the integrator 50. The signal S50 is compared with ½ of the power supply voltage VDD by the comparator 60. Because the duty ratio of the clock signal CK2 is 50% or higher, the signal S60 which is the result of comparison is "H".

When at time t1a the pulse signal PS from the pulse generator 71 goes to "L", the decoder 73 enters the operating state, and an "H" write signal WR1 is generated from the output terminal Q0 in response to the count value CNT (=0) of the binary counter 72. Thus, the signal S60 is latched in the FF 74a, and the selection signals SEL1 goes to "H".

When at time t1b the pulse signal PS returns to "H", the count value CNT of the binary counter 72 is increased by 1, to become 1, with the timing of the rising edge of the pulse signal PS. Also, operation of the decoder 73 is halted, and the write signal WR1 returns to "L".

By having the selection signal SEL1 go to "H", the clock signal CK1 in the frequency doubler 20 passes through the selector 24, delay unit 25, selector 26 and delay unit 27 to be introduced to the input terminal A of the selector 28. On the other hand, this signal is inverted by the inverter 29 and introduced to the input terminal B of the selector 28. Consequently the delay time of the clock signal CK1 is twice that of the delay unit (2DLY). As a result, the duty ratio of the clock signal CK2 is smaller than when the delay time is DLY, and the voltage of the signal S50 generated from the integrator 50 also falls. If the duty ratio of the clock signal CK2 at this time exceeds 50%, the voltage of the signal S50 becomes equal to or greater than VDD/2, and the signal S60 remains at "H".

At time t2a, when the pulse signal PS from the pulse generator 71 again goes to "L", the decoder 73 enters the operating state, and an "H" write signal WR2 is generated from the output terminal Q1 in response to the count value CNT (=1) of the binary counter 72. As a result, the signal S60 is latched by the FF 74b, and the selection signal SEL2 goes to "H". At this time the FF 74a does not operate, and so the selection signals SEL1 remains at "H".

When at time t2b the pulse signal PS returns to "H", the count value CNT of the binary counter 72 is increased by 1 to a value of 2, with the timing of the rising edge of the pulse signal PS. Operation of the decoder 73 is halted, and the write signal WR2 returns to "L".

By having the selection signals SEL1 and SEL2 go to "H", the clock signal CK1 in the frequency doubler 20 passes through the selector 22, delay unit 23, selector 24, delay unit 25, selector 26, and delay unit 27, and is introduced to the input terminal A of the selector 28. The output signal of the delay unit 27 is inverted by the inverter 29 and introduced to the input terminal B of the selector 28. Hence the delay time of the clock signal CK1 is three times that of the delay unit (3DLY).

As a result, the duty ratio of the clock signal CK2 is further smaller than when the delay time is 2DLY, and the voltage of the signal S50 generated from the integrator 50 is also lowered. If the duty ratio of the clock signal CK2 at this time is less than 50%, the voltage of the signal S50 is less than VDD/2, and the signal S60 goes to "L".

When at time t3a the pulse signal PS from the pulse generator 71 again goes to "L", the decoder 73 enters the operating state, and an "H" write signal WR3 is output from the output terminal Q2 in response to the count value CNT (=2) of the binary counter 72. Thus, the signal S60 is latched by the FF 74c. Because the signal S60 is "L", the selection signal SEL3 remains at "L".

When at time t3b the pulse signal PS returns to "H", the count value CNT of the binary counter 72 is increased by 1, to 3, with the timing of the rising edge of the pulse signal PS. Also, operation of the decoder 73 is halted, and the write signal WR3 returns to "L".

The states of the selection signals SEL1 to SEL3 do not change, so that the operation of the frequency doubler 20 also continues in the same state.

When at time t4a the pulse signal PS from the pulse generator 71 goes to "L", the decoder 73 again enters the operating state, and an "H" signal is output from the unconnected output terminal Q4 in response to the count value CNT (=3) of the binary counter 72.

When at time t4b the pulse signal PS returns to "H", the count value CNT of the binary counter 72 is increased by 1 to become 4 with the timing of the rising edge of the pulse signal PS, and the signal S72 from the output terminal Q2 goes to "H". As a result, the selector 40 selects the clock signal CLK which is the output signal of the frequency doubler 30, and the clock signal CLK is output as the signal S40.

Through the above operation, adjustment of the duty ratio in the frequency doubler 20 ends, and thereafter, in the frequency doubler 30 of the next stage, adjustment of the duty ratio is begun in a manner similar to that of the frequency doubler 20. In adjustment of the duty ratio in the frequency doubler 30, the count value CNT of the binary counter 72 continues to be increased by the pulse signal PS which continues to be output from the pulse generator 71, and based on the duty ratio of the clock signal CLK from the frequency doubler 30, the selection signals SEL4 through SEL6 are determined.

As described above, the duty adjustment circuit 5' of this embodiment has the frequency divider 10 which divides the frequency of a provided clock signal CK by 4, the frequency doublers 20 and 30 which delay the frequency-divided clock signal, and use the delay time to double the frequency, and the control portion 70 which, by sequentially changing the delay times of the frequency doublers 20 and 30, adjusts the duty ratio of the output clock signal to a value close to 50%.

Accordingly, even when high-level instantaneous noise due to electrostatic discharge or other causes is applied, the effect of the noise is dispersed by the frequency divider 10, so that the possibility that a clock signal with an extremely narrow pulse width may be output is eliminated. The duty ratio is adjusted through the delay times of the frequency doublers 20 and 30, so that a duty ratio close to 50% can be obtained.

The above described embodiment is merely intended to elucidate the technical nature of this invention. The invention should not be interpreted narrowly as being limited to the above embodiment, but can be variously modified within the scope of the claims. For example, the following modifications (a) to (d) can be made.

(a) The division ratio of the frequency divider 10 is not limited to ¼, but may be ⅛, 1/16, 1/32, or any arbitrary fraction ½$^n$. In this case, in order to return the clock signal to the original frequency, n frequency doublers are used.

(b) In the frequency doubler 20 and similar, the delay time can be adjusted in three stages; but if adjustment is made in a greater number of stages, the duty ratio can be adjusted to be still closer to 50%.

(c) In the frequency doubler 20, the delay units 21, 23, 25 and 27 with the same delay time DLY are used; but the delay times of the respective delay units may be made different. For example, when the frequency of the clock signal CK is decided in advance, the delay time of the first inserted delay unit is set such that the duty ratio becomes somewhat higher than 50%, and thereafter, by inserting delay units with smaller delay times in sequence, the duty ratio is fine-adjusted to approach 50%.

(d) The control portion 70 is configured so as to perform sequential control using a combination of logic circuits; but another configuration may also be employed in which a microcomputer or similar is used to incorporate an appropriate combination of selection signals. When employing such a configuration, the delay times of the delay units in the frequency doubler 20 are set to be related as powers of 2, such as 1, 2, 4, 8, and selection is made in order starting from the delay units with larger delay times, so that a desired duty ratio can be obtained in a short length of time, using a small number of frequency doublers.

This application is based on a Japanese Patent Application No. 2004-49278 filed on Feb. 25, 2004, and the entire disclosure thereof is incorporated herein by reference.

What is claimed is:

1. A duty adjustment circuit comprising:
a frequency divider for dividing a frequency of an input clock signal by $2^n$ (where n is a natural number greater than 1) to provide a frequency-divided clock signal, the frequency divider having an input and an output; and
n stages of frequency doublers connected to the output of the frequency divider, said n stages of frequency doublers being arranged in a cascade connection, for adjusting the frequency-divided clock signal to a clock signal having a same frequency as the input clock signal, with a duty ratio adjusted to a prescribed value, wherein each said frequency doubler includes:
a variable delay portion, which delays an introduced signal from said frequency divider or said frequency doubler of a previous stage among said n stages, by an amount of time according to a control signal thereby providing a delayed signal;
a frequency doubler portion, which calculates an exclusive logical sum of said introduced signal and the delayed signal to generate and output a frequency-doubled signal to said frequency doubler of a next stage among said n stages;
an average value detection portion, which detects an average voltage of said frequency-doubled signal; and,
a comparison control portion, which compares said average voltage with a reference voltage, adjusts said control signal such that the average voltage becomes equal to the reference voltage, and applies the adjusted control signal to said variable delay portion.

2. The duty adjustment circuit according to claim 1, wherein the frequency divider includes a 2-bit binary counter.

3. The duty adjustment circuit according to claim 1, wherein the average value detection portion includes an integrator having a substantially greater time constant than a period of the frequency-doubled signal.

4. The duty adjustment circuit according to claim 1, wherein the comparison control portion includes a combination of logic circuits to perform sequence control.

5. A duty adjustment circuit, comprising:
a frequency divider, which lowers a frequency of an input clock signal to $\frac{1}{2^n}$ (where n is a natural number) by alternately inverting an output signal with a timing of a rising or falling edge of the input clock signal, the frequency divider having an input and an output;
n frequency doublers, which are n-stage cascade-arranged and connected to the output of the frequency divider, each said frequency doubler having a plurality of delay units, such that each said frequency doubler uses one of said delay units selected by a selection signal to delay an introduced signal from said frequency divider or said frequency doubler of a previous stage among said n stages, thereby providing a delayed signal, and each said frequency doubler uses a logic gate to calculate an exclusive logical sum of the delayed signal and the introduced signal, generates a signal having twice a frequency of the introduced signal, and outputs the signal thus generated to said frequency doubler of a next stage among said n stages;
a selector, which selects one of the output signals of said n frequency doublers according to a switching signal;
an average value detection portion, which detects an average voltage of the selected signal provided from said selector;
a comparator, which compares said average voltage with a reference voltage to provide a comparison result; and,
a control portion, which generates said switching signal, and which outputs in sequence said selection signals to said delay units in the selected frequency doubler until said comparison result changes.

6. The duty adjustment circuit according to claim 5, wherein delay times of said delay units in each said frequency doubler are related to each other by a power of 2, as in 1:2:4, and wherein said delay units are selected in order from the delay unit having the longest delay time by said selection signals.

7. The duty adjustment circuit according to claim 5, wherein the delay units in each said frequency doubler have different delay times.

8. The duty adjustment circuit according to claim 5, wherein the frequency divider includes a 2-bit binary counter.

9. The duty adjustment circuit according to claim 5, wherein the average value detection portion includes an integrator having a substantially greater time constant than a period of the selected signal.

10. The duty adjustment circuit according to claim 5, wherein the control portion includes a combination of logic circuits to perform sequence control.

11. An apparatus for duty adjustment, comprising:
first means for dividing a frequency of an input clock signal by $2^n$ (where n is a natural number), the first means having an input and an output;
n second means, which are n-stage cascade-arranged and connected to the output of the first means, each said second means having a plurality of delay means, such that each said second means uses one of said delay means selected by a selection signal to delay an introduced signal from said first means or said second means of a previous stage among said n stages, thereby providing a delayed signal, and each said second means calculates an exclusive logical sum of the delayed signal and the introduced signal, generates a signal having twice a frequency of the introduced signal, and outputs the signal thus generated to said second means of a next stage among said n stages;
third means for selecting one of the output signals of said n second means according to a switching signal;
fourth means for calculating an average voltage of the selected signal provided from said third means;

fifth means for comparing said average voltage with a reference voltage to provide a comparison result; and, sixth means for generating said switching signal, and for outputting in sequence said selection signals to said delay means in the selected second means until said comparison result changes.

12. The apparatus according to claim 11, wherein delay times of said delay means in each said second means are related to each other by a power of 2, as in 1:2:4, and wherein said delay means are selected in order from the delay means having the longest delay time by said selection signals.

13. The apparatus according to claim 11, wherein the delay means in each said second means have different delay times.

14. The apparatus according to claim 11, wherein the first means includes a 2-bit binary counter.

15. The apparatus according to claim 11, wherein the fourth means includes an integrator having a substantially greater time constant than a period of the selected signal.

16. The apparatus according to claim 11, wherein the sixth means includes a combination of logic circuits to perform sequence control.

17. A duty adjustment circuit comprising:

a frequency divider for dividing a frequency of an input clock signal by $2^n$ (where n is a natural number) to provide a frequency-divided clock signal, the frequency divider having an input and an output; and n stages of frequency doublers connected to the output of the frequency divider, said n stages of frequency doublers being arranged in a cascade connection, for adjusting the frequency-divided clock signal to a clock signal having a same frequency as the input clock signal, with a duty ratio adjusted to a prescribed value, wherein each said frequency doubler includes a variable delay portion, which delays an introduced signal from said frequency divider or said frequency doubler of a previous stage among said n stages, by an amount of time according to a control signal thereby providing a delayed signal, a frequency doubler portion, which calculates an exclusive logical sum of said introduced signal and the delayed signal to generate and output a frequency-doubled signal to said frequency doubler of a next stage among said n stages, an average value detection portion, which detects an average voltage of said frequency-doubled signal, and a comparison control portion, which compares said average voltage with a reference voltage, adjusts said control signal such that the average voltage becomes equal to the reference voltage, and applies the adjusted control signal to said variable delay portion, wherein the comparison control portion includes a combination of logic circuits to perform sequence control.

18. The duty adjustment circuit according to claim 17, wherein the frequency divider includes a 2-bit binary counter.

19. The duty adjustment circuit according to claim 17, wherein the average value detection portion includes an integrator having a substantially greater time constant than a period of the frequency-doubled signal.

* * * * *